US012557586B1

(12) United States Patent
Koppikar et al.

(10) Patent No.: US 12,557,586 B1
(45) Date of Patent: Feb. 17, 2026

(54) SOLDER REFLOW WITH OPTICAL ENDPOINT CONTROL

(71) Applicant: Yield Engineering Systems Inc., Fremont, CA (US)

(72) Inventors: Sandeep R. Koppikar, Karnataka (IN); John Lewis, Fremont, CA (US); Vladimir Kudriavtsev, Palo Alto, CA (US); Saket Chadda, Fremont, CA (US)

(73) Assignee: Yield Engineering Systems, Inc., Fremont, CA (US)

( * ) Notice: Subject to any disclaimer, the term of this patent is extended or adjusted under 35 U.S.C. 154(b) by 0 days.

(21) Appl. No.: 19/084,370

(22) Filed: Mar. 19, 2025

(51) Int. Cl.
*H01L 21/67* (2006.01)
*G01J 5/00* (2022.01)
*H01L 21/60* (2006.01)
*H01L 21/66* (2006.01)

(52) U.S. Cl.
CPC ...... *H01L 21/67248* (2013.01); *G01J 5/0007* (2013.01); *H01L 21/60* (2021.08); *H01L 22/12* (2013.01); *H01L 22/24* (2013.01); *G01J 2005/0077* (2013.01); *H01L 2021/60052* (2013.01)

(58) Field of Classification Search
CPC ... H01L 21/67248; H01L 22/12; H01L 22/24; H01L 22/30; H01L 22/32; H01L 22/34
See application file for complete search history.

(56) References Cited

U.S. PATENT DOCUMENTS

| 4,890,781 | A | | 1/1990 | Johnson et al. |
| 6,100,506 | A | * | 8/2000 | Colelli, Jr. ........ H01L 21/67248 118/725 |
| 6,191,399 | B1 | * | 2/2001 | Van Bilsen ....... H01L 21/67248 392/416 |
| 2006/0240680 | A1 | | 10/2006 | Yokota et al. |
| 2007/0020784 | A1 | | 1/2007 | Timans |

(Continued)

OTHER PUBLICATIONS

JP 2005530997A, System and Method for Calibrating a Temperature Measuring Device in a Heat Treatment Chamber, Oct. 13, 2005 (Year: 2005).*

(Continued)

*Primary Examiner* — Alexander G Ghyka
(74) *Attorney, Agent, or Firm* — Fish & Richardson P.C.

(57) ABSTRACT

A solder reflow system that includes a vacuum chamber and a sample chuck in the vacuum chamber to support a semiconductor wafer to be processed. The solder reflow system further include a heating element coupled to the vacuum chamber and configured to heat the semiconductor wafer, a thermocouple connected to the sample chuck to measure a temperature of the semiconductor wafer, a pyrometer positioned to detect an optical signal from the semiconductor wafer to estimate the temperature of the semiconductor wafer. The control system is configured to control the heating element to heat the semiconductor wafer, obtain one or more measurements of the temperature of the semiconductor wafer from the thermocouple and one or more estimates of the temperature of the semiconductor wafer from the pyrometer during the heating of the semiconductor wafer, and determine a modification of the heating of the semiconductor wafer based on the obtained measurements.

15 Claims, 10 Drawing Sheets

(56) References Cited

U.S. PATENT DOCUMENTS

2015/0334849 A1   11/2015   Tsubota
2019/0304820 A1   10/2019   Baggett et al.

OTHER PUBLICATIONS

Felice et al., "Pyrometry of Materials With Changing, Spectrally-Dependent Emissivity—Solid & Liquid Metals," Paper, Presented at the Ninth International Temperature Symposium, Anaheim, CA, Mar. 19-23, 2012; American Institute of Physics, Sep. 2013, 1552(1):734-739.

International Search Report and Written Opinion in International Application No. PCT/US2025/025109, mailed on Jul. 1, 2025, 16 pages.

\* cited by examiner

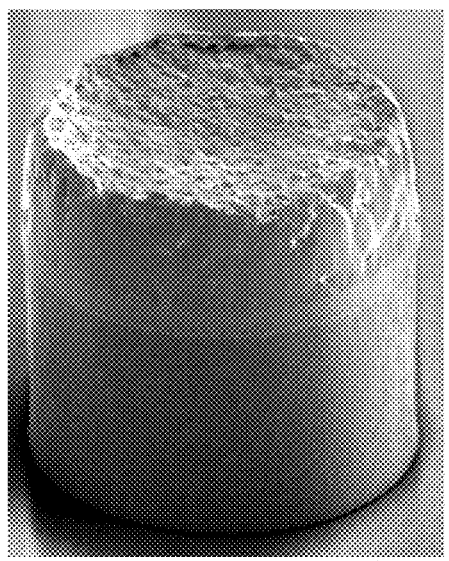
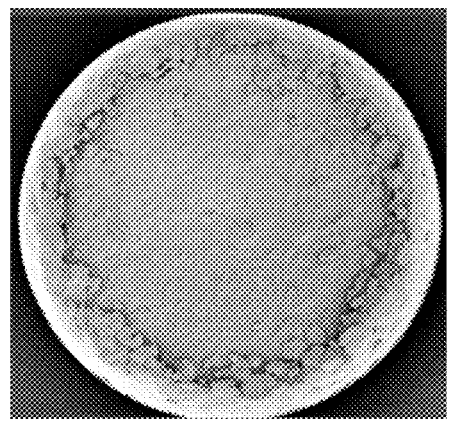
FIG. 7A  FIG. 7B
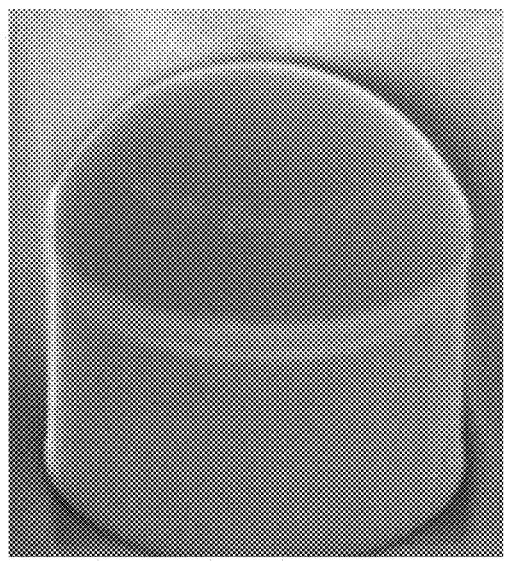
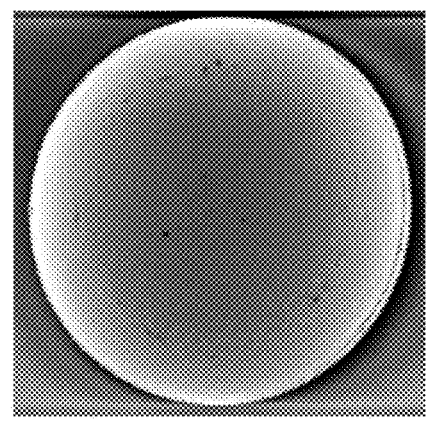
FIG. 8A  FIG. 8B

SOLDER REFLOW WITH OPTICAL ENDPOINT CONTROL

TECHNICAL FIELD

The present disclosure generally relates to solder reflow processes with optical endpoint control.

BACKGROUND

Solder reflow, which is a step in chip packaging, involves the melting of solder alloy coatings on bond pads, microbumps, and pillars. This process requires heating the alloy above its liquidus temperature long enough to achieve complete melting and forming smooth, spherical alloy surfaces. The time the alloy is held above its liquidus temperature has to be balanced to ensure complete melting without causing non-planar bumps or over-reflow. Incomplete or over-reflow can compromise the quality and performance of the solder joints, making proper process control important to achieve uniform and coplanar bumps.

SUMMARY

Implementations of the present disclosure are generally directed to systems and methods for solder reflow with optical endpoint control. The optical endpoint control for solder reflow in this disclosure can be enabled by employing at least two different means for temperature measurements. A non-optical means, e.g., a thermocouple, can be combined with an optical means, e.g., a pyrometer, to allow comparison of the temperature measurements. Since solder reflow process typically involves changes in surface compositions, e.g., removal of a surface oxide layer, and surface morphology, the measurements by the two means can differ from one another depending on changes in infrared (IR) emissivity, light reflectivity, and/or scattering patterns. Accordingly, a user can obtain information about the process of the solder reflow process by comparing the measurements by the two means. Optically, the solder reflow system can also include various additional features such as a secondary optical system to improve the accuracy and efficiency of the optical endpoint control.

An implementation of this disclosure provides a solder reflow system that includes a vacuum chamber and a sample chuck in the vacuum chamber to support a semiconductor wafer to be processed. The solder reflow system further includes a heating element coupled to the vacuum chamber and configured to heat the semiconductor wafer, a thermocouple connected to the sample chuck to measure a temperature of the semiconductor wafer, a pyrometer positioned to detect an optical signal from the semiconductor wafer to estimate the temperature of the semiconductor wafer. The control system is configured to control the heating element to heat the semiconductor wafer, obtain one or more measurements of the temperature of the semiconductor wafer from the thermocouple and one or more estimates of the temperature of the semiconductor wafer from the pyrometer during the heating of the semiconductor wafer, and determine a modification of the heating of the semiconductor wafer based on the obtained measurements.

In an aspect, determining the modification of the heating of the semiconductor wafer based on the obtained measurements includes comparing the one or more measurements from the thermocouple to the one or more estimates from the pyrometer, and based on the comparison, determining if a difference between the one or more measurements form the thermocouple and the one or more estimates from the pyrometer begins to change; and if yes, modifying a parameter of the heating element.

In an aspect, combinable with any other aspect, the pyrometer is positioned outside the vacuum chamber, and the vacuum chamber includes a window positioned to allow the optical signal to pass through and reach the pyrometer.

In an aspect, combinable with any other aspect, the pyrometer is an infrared (IR) pyrometer, and the optical signal is an IR emitted from the semiconductor wafer.

In an aspect, the obtained measurements include a change in IR emissivity of the semiconductor wafer during the heating. The change in IR emissivity is determined by comparing the one or more measurements from the thermocouple to the one or more estimates from the pyrometer.

In an aspect, combinable with any other aspect, the solder reflow system further includes a secondary optical system to measure a reflected light from the semiconductor wafer. The secondary optical system includes a light source positioned to emit a light to irradiate the semiconductor wafer, at least a portion of the light reflecting on a surface of the semiconductor wafer, and a detector positioned to detect the reflected light from the semiconductor wafer. The control system is coupled to the light source and the detector, and is further configured to obtain one or more measurements of the reflected light, based on the one or more measurements of the reflected light, determine a change in reflectivity of the semiconductor wafer during the heating of the semiconductor wafer, and based on the change in reflectivity, change a parameter of the heating element.

In an aspect, the reflected light includes light in a spectrum visible to the human eye.

In an aspect, combinable with any other aspect, the control system is further configured to, based on the reflected light, determine a change in scattering pattern during the heating.

In an aspect, combinable with any other aspect, the solder reflow system further includes an imaging system including a camera positioned outside the vacuum chamber. The vacuum chamber includes a window positioned to allow the camera to capture one or more images or videos of the semiconductor wafer during the heating. The control system is coupled to the camera and is configured to determine, based on the one or more images or videos, a change in shape, color, or brightness of a surface of the semiconductor wafer, and based on the change, change a parameter of the heating element.

An implementation of this disclosure provides a solder reflow system including a vacuum chamber and a sample chuck in the vacuum chamber to support a semiconductor wafer to be processed. The solder reflow system further includes a heating element coupled to the vacuum chamber and configured to heat the semiconductor wafer. The solder reflow system further includes a thermocouple coupled to the sample chuck to measure a temperature of the semiconductor wafer. The solder reflow system further includes an infrared (IR) pyrometer positioned to detect an IR signal from the semiconductor wafer. The solder reflow system further includes a visible light source positioned to irradiate a visible light to the semiconductor wafer. The solder reflow system further includes a detector to detect a reflected visible light from the semiconductor wafer.

In an aspect, the visible light source includes a green laser or a blue laser.

In an aspect, combinable with any other aspect, the semiconductor wafer includes a solder region with a surface oxide layer. The solder reflow system further includes a control system including one or more processors and a non-transitory memory storing instructions that, when executed, cause the one or more processors to: heat the semiconductor wafer; introduce a reducing agent into the vacuum chamber, the reducing agent configured to remove the surface oxide layer; monitor the temperature of the semiconductor wafer using the thermocouple; measure the IR signal from the solder region of the semiconductor wafer using the IR pyrometer; estimate the temperature of the semiconductor wafer based on the IR signal; based on comparing the temperature measured by the thermocouple and the estimated temperature, determine an endpoint of the removal of the surface oxide layer; and in response to determining the endpoint, raise the temperature of the semiconductor wafer to reflow the solder region.

In an aspect, the non-transitory memory stores further instructions that, when executed, cause the one or more processors to: in response to determining the endpoint, remove an unreacted portion of the reducing agent from the vacuum chamber prior to raising the temperature of the semiconductor wafer to reflow the solder region.

In an aspect, combinable with any other aspect, the non-transitory memory stores further instructions that, when executed, cause the one or more processors to, based on the comparing, determine a change in IR emissivity.

In an aspect, combinable with any other aspect, the non-transitory memory stores further instructions that, when executed, cause the one or more processors to: monitor an intensity of the reflected light at a fixed location using the detector, and based on the intensity of the reflected light, determine a change in reflectivity, wherein determining the endpoint of the removal of the surface oxide layer is based on the change in reflectivity.

In an aspect, combinable with any other aspect, the non-transitory memory stores further instructions that, when executed, cause the one or more processors to: while reflowing the solder region, monitor an intensity of the reflected light at a fixed location using the detector, based on the intensity of the reflected light, determine a change in reflectivity, based on the change in reflectivity, determine a reflow endpoint, and in response to determining the reflow endpoint, lower the temperature of the semiconductor wafer to terminate the reflow.

In an aspect, combinable with any other aspect, the non-transitory memory stores further instructions that, when executed, cause the one or more processors to: monitor a scattering pattern of the reflected light using the detector, and based on the scattering pattern of the reflected light, determine a change in the scattering pattern. Determining the endpoint of the removal of the surface oxide layer is based on the change in the scattering pattern.

In an aspect, combinable with any other aspect, the non-transitory memory stores further instructions that, when executed, cause the one or more processors to: while reflowing the solder region, monitor a scattering pattern of the reflected light using the detector, and based on the scattering pattern of the reflected light, determine a change in the scattering pattern, based on the change in the scattering pattern, determine a reflow endpoint, and in response to determining the reflow endpoint, lower the temperature of the semiconductor wafer to terminate the reflow.

An implementation of this disclosure provides a method of solder reflow for a semiconductor wafer. The method includes: positioning a semiconductor wafer to be processed in a vacuum chamber, the semiconductor wafer including a solder region with a surface oxide layer; heating the semiconductor wafer using a heating element; introducing a reducing agent into the vacuum chamber, the reducing agent configured to remove the surface oxide layer; monitoring a temperature of the semiconductor wafer using a thermocouple coupled to a sample chuck supporting the semiconductor wafer; measuring an optical signal emitted from the solder region of the semiconductor wafer using a pyrometer; estimating the temperature of the semiconductor wafer based on the optical signal measured by the pyrometer; based on comparing the temperature measured by the thermocouple and the estimated temperature, determining an endpoint of the removal of the surface oxide layer; and in response to determining the endpoint, raising the temperature of the semiconductor wafer to reflow the solder region.

In an aspect, the method further includes, in response to determining the endpoint, removing an unreacted portion of the reducing agent from the vacuum chamber prior to raising the temperature of the semiconductor wafer to reflow the solder region.

In an aspect, combinable with any other aspect, the optical signal includes an infrared (IR) signal, and the pyrometer includes an IR pyrometer.

In an aspect, the heating element is an IR lamp, and wherein heating the semiconductor wafer includes intermittently powering the IR lamp, and the method further includes, while comparing the temperature measured by the thermocouple and the optical signal to obtain the information, excluding data collected when the IR lamp is turned on.

In an aspect, the heating element is an IR lamp, and wherein heating the semiconductor wafer includes intermittently powering the IR lamp, and the method further includes, while comparing the temperature measured by the thermocouple and the optical signal to obtain the information, collecting data only when the IR lamp is turned off.

In an aspect, the method further includes: irradiating a light to the semiconductor wafer using a light source; detecting a reflected light from the semiconductor wafer using a detector; monitoring an intensity of the reflected light at a fixed location, and based on the intensity of the reflected light, determining a change in reflectivity, wherein determining the endpoint of the removal of the surface oxide layer is based on the change in reflectivity.

In an aspect, combinable with any other aspect, the method further includes: while reflowing the solder region; irradiating a light to the semiconductor wafer using a light source; detecting a reflected light from the semiconductor wafer using a detector; monitoring an intensity of the reflected light at a fixed location; based on the intensity of the reflected light, determining a change in reflectivity; based on the change in reflectivity, determining a reflow endpoint; and in response to determining the reflow endpoint, lowering the temperature of the semiconductor wafer to terminate the reflow.

In an aspect, combinable with any other aspect, the method further includes: irradiating a light to the semiconductor wafer using a light source; detecting a reflected light from the semiconductor wafer using a detector; monitoring a scattering pattern of the reflected light using the detector, and based on the scattering pattern of the reflected light, determining a change in the scattering pattern, wherein determining the endpoint of the removal of the surface oxide layer is based on the change in the scattering pattern.

In an aspect, combinable with any other aspect, the method further includes: while reflowing the solder region, irradiating a light to the semiconductor wafer using a light source; detecting a reflected light from the semiconductor wafer using a detector; monitoring a scattering pattern of the reflected light using the detector; based on the scattering pattern of the reflected light, determining a change in the scattering pattern; based on the change in the scattering pattern, determining a reflow endpoint; and in response to determining the reflow endpoint, lowering the temperature of the semiconductor wafer to terminate the reflow.

In an aspect, combinable with any other aspect, the removal of the surface oxide layer is performed within a temperature range from 150° C. to 180° C., and the reflow of the solder region is performed within a temperature range from 230° C. to 250° C.

The details of one or more implementations of the subject matter of this disclosure are set forth in the accompanying drawings and the description below. Other features, aspects, and advantages of the subject matter will become apparent from the description, the drawings, and the claims.

BRIEF DESCRIPTION OF THE DRAWINGS

FIGS. 7A-7B show scanning electron microscopic (SEM) images of a solder region over a copper pillar made on a substrate before a reflow process.

FIGS. 8A-8B show SEM images of the solder region after the reflow process.

DETAILED DESCRIPTION

Various aspects of this disclosure describe apparatus and methods for materials processing, particularly suitable for solder reflow. Solder reflow is a key process in chip packaging, requiring precise heating of solder alloy coatings to form smooth, spherical surfaces. Proper control of the heating time above the liquidus temperature is important to avoid non-planar bumps or over-reflow, which can affect solder joint quality and lower the yield in subsequent processes such as bonding. In various implementations, the apparatus described herein enhances the solder reflow process by introducing optical endpoint control. This optical endpoint control can be achieved by combining non-optical and optical temperature measurements. The disclosed techniques allow detecting IR emissivity changes, which can be attributed to changes in surface composition and morphology, indicating the progress of the solder reflow.

Figure 5:
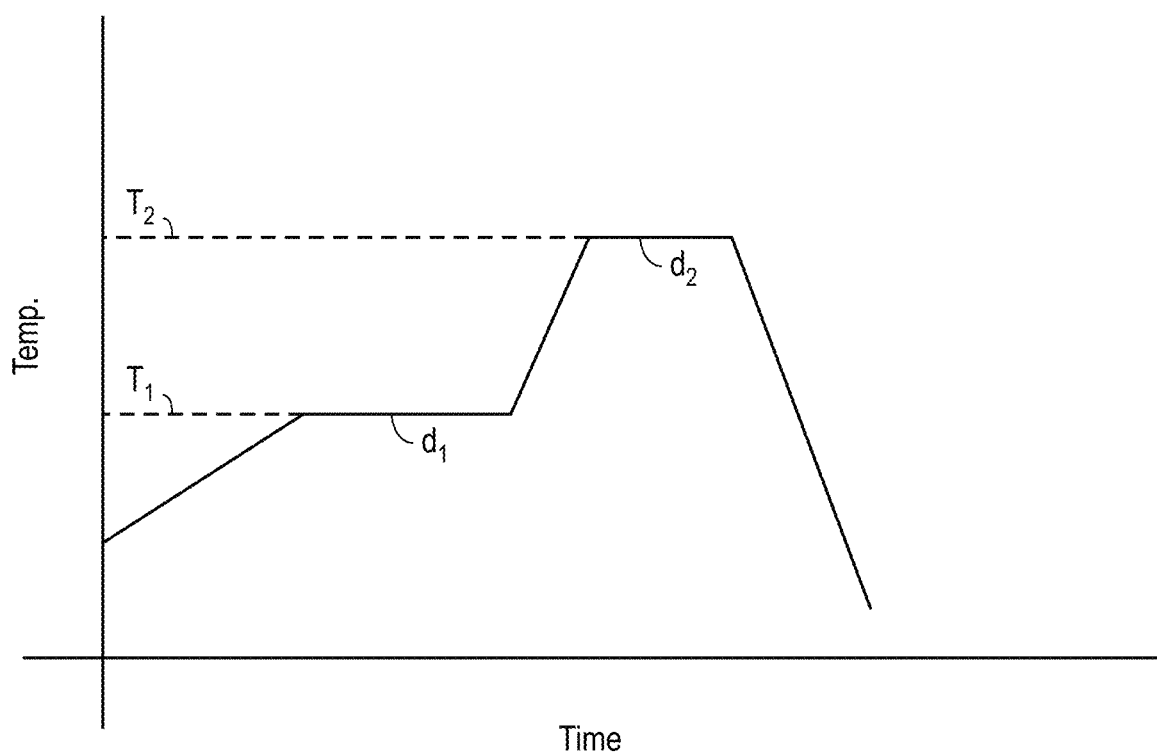
FIG. 5 shows a diagram of a temperature profile for a solder reflow process.
Figure 6:
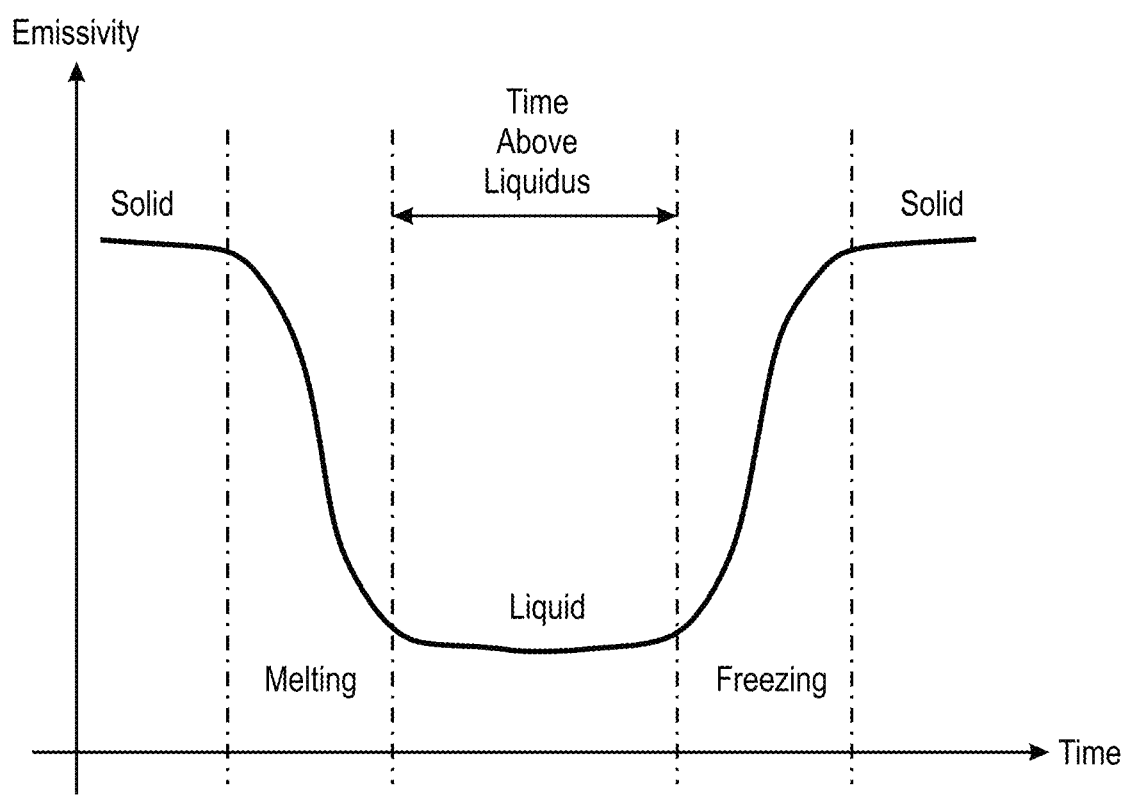
FIG. 6 shows a relation between time above liquidus (TAL) and emissivity or reflectivity.

In the following, the apparatus of this disclosure, e.g., a solder reflow system equipped with two means for temperature measurements, is first described referring to FIGS. 1-3. The steps of surface structural changes during the solder reflow process are described referring to FIGS. 4A-4C, 7A-7B, 8A-8B along with a temperature profile during the process in FIG. 5. In FIG. 6, changes in emissivity or reflectivity are described in relation to optimizing TAL. In FIGS. 9A-9B and 10A-10B, as an example for the structural changes during the reflow process, scattering patterns for two possible surface morphologies are described. The methods of solder reflow process that can be performed using the apparatus of this disclosure are described referring to FIG. 11.

In various implementation of this disclosure, the solder reflow system can offer various advantaged over conventional systems and techniques. In general, optimizing the process parameters such as process time for each step is highly tedious, if not impossible, because even small changes in solder alloy composition or heat-transfer characteristics of the vacuum chamber can compromise the yield of the reflow process. Some alloys may melt at slightly higher or lower temperatures or go through a longer melting stage, or the heating and cooling characteristics of the surface could change for various reasons. Various implementations of this disclosure use at least two means of temperature measurements, enabling direct, real-time optical analysis of the surface of the semiconductor wafer. The optical analysis can detect various key timings during the reflow process. For example, they are the endpoint of the soak step, the starting point of TAL (when solder reflow begins), and when it ends. Advantageously, the methods here can help minimize the TAL without impacting process performance, even if the solder alloy composition or heat-transfer characteristics vary.

Figure 1:
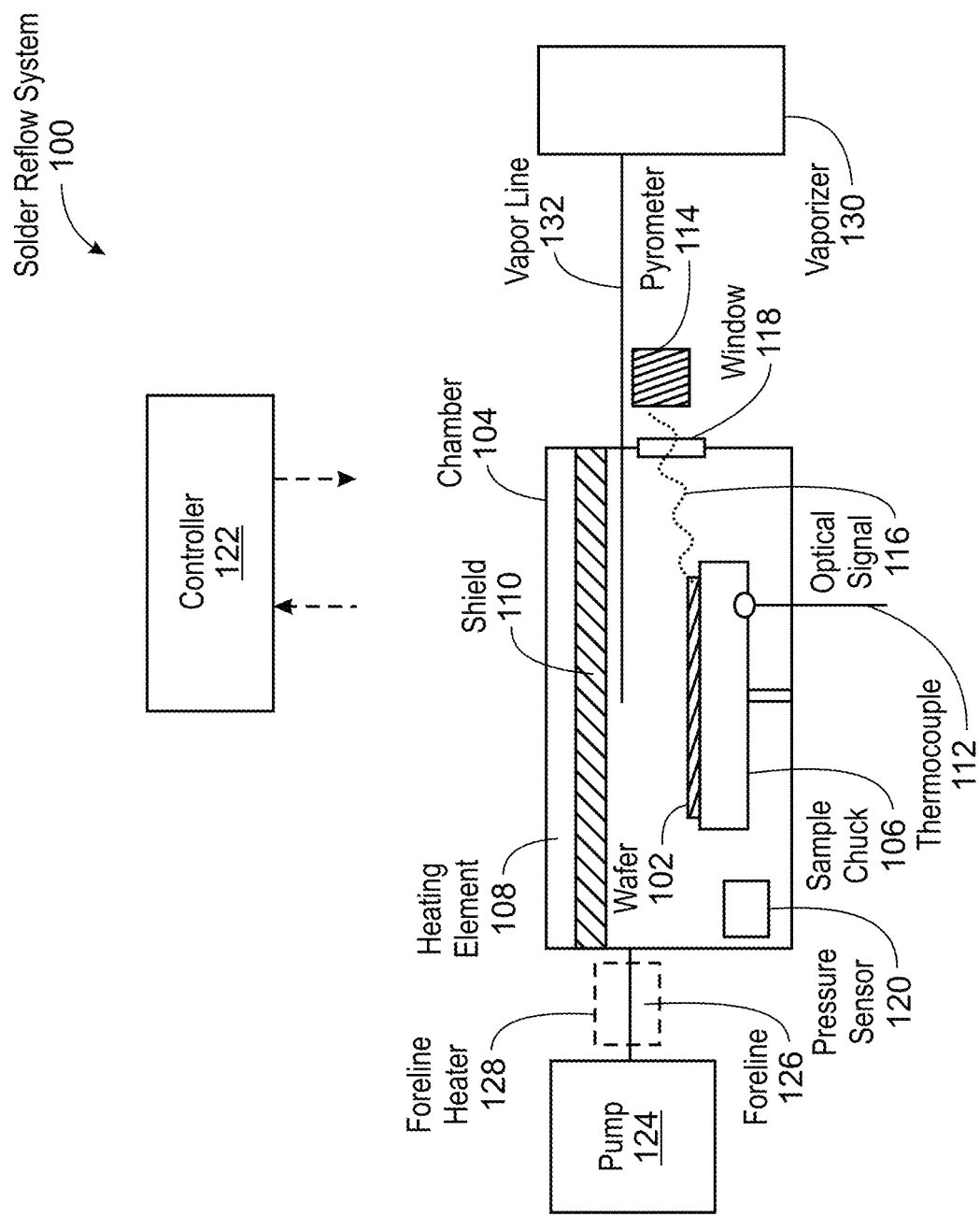
FIG. 1 shows a schematic of a solder reflow system having a pyrometer for optical endpoint control.

FIG. 1 illustrates a solder reflow system 100 according to an implementation of this disclosure. The solder reflow system 100 can be used to perform a controlled thermal treatment of a semiconductor wafer 102 as a solder reflow process Generally, in a solder reflow process, electrical components attached to a substrate, e.g., a printed circuit board (PCB), by a solder paste are placed in a chamber, e.g., an oven, and heated to "reflow" the solder (converting the solder into a molten state) and reform the solder joints, making the joints stronger and permanent. Solder reflow process can enable the precise and automated assembly of electronic components onto PCBs, and play an important role in assembling miniaturized components and surface mount devices (SMDs). Accordingly, in various implementations, the semiconductor wafer 102 includes various electronic components to be bonded using solder for devices and have been processed by preceding fabrication processes, e.g., solder paste application and component placement. For example, the semiconductor wafer 102 can include a glass panel with tin contacts to be bonded.

As illustrated in FIG. 1, the solder reflow system 100 can include a vacuum chamber 104 having a sample chuck 106 to support the semiconductor wafer 102. In various implementations, the sample chuck 106 has one or more features to securely hold the semiconductor wafer 102, e.g., by vacuum, electrostatic forces, magnetic forces, or mechanical means such as clamps or pins. In some implementations, the sample chuck 106 is designed with rotational capabilities to allow for uniform process conditions across the semiconductor wafer 102.

The vacuum chamber 104 can additionally include further sample-handling and/or other components such as load-lock (s), transfer arm(s), a vent inlet, and/or the like. Also, it will be understood that the illustration of the solder reflow system 100 in FIG. 1 does not exclude the presence of additional or alternative components, such as additional valves, sensors, fluid-handling components, sample-handling components, gas sources, and/or the like.

The solder reflow system 100 can further include a heating element to heat the semiconductor wafer 102. In some implementations, the heating element 108 is for radiative heating, for example, using an infrared (IR) lamp. In other implementations, the heating element 108 can include resistive/convective heating. The heating element 108 can be positioned to facilitate uniform heating of the semiconductor wafer 102. As illustrated in FIG. 1, for example, the heating element 108 can be positioned at or near the top of the vacuum chamber 104. Further, the solder reflow system 100 can include a shield 110 between the heating element 108 and the semiconductor wafer 102 to assist even heat distribution and wafer protection from contamination. For example, a quartz plate can be used for the shield 110. In some implementations, the quartz plate can be from about 1 to about 3 inches.

In various implementations, the solder reflow system 100 includes two means for temperature measurements to enable precise optical endpoint control. As illustrated in FIG. 1, a non-optical means can use a thermocouple 112 connected to the sample chuck 106. In accordance with one implementation, the thermocouple 112 is illustrated to be connected to the back surface of the sample chuck 106. In other implementations, the thermocouple 112 can be positioned elsewhere, e.g., the top surface of the sample chuck 106.

In various implementations, an optical means can use a pyrometer 114 to detect an optical signal 116 for temperature measurement. For example, an IR pyrometer can be used to measure an IR emitted from the semiconductor wafer 102. In some implementations, the pyrometer 114 can use a light at another range of wavelength, e.g., visible light. The pyrometer 114 can be placed outside the vacuum chamber 104 and the solder reflow system 100 can have a window 118 to allow the optical signal 116 to reach the pyrometer 114. Accordingly, the window 118 can be made of an IR transparent material such as quartz. As illustrated in FIG. 1, positioning the pyrometer 114 and the window 118 at the side of the vacuum chamber 104 can eliminate the influence of the IR directly form the heating element 108 on the measurement. It should still be noted that the location and number of the pyrometer 114 and the window 118 illustrated in FIG. 1 are for example only. In some implementations, more than one optical means and or windows can be used.

Still referring to FIG. 1, in some implementations, the vacuum chamber 104 further includes a pressure sensor 120 configured to sense an internal pressure of the vacuum chamber 104. In some implementations, signals from the pressure sensor 120 are provided to a controller 122, and the controller 122, based on the chamber pressure, adjusts one or more process parameters, such as push pressure, pulse on-time, and/or pulse off-time, in order to achieve a target pressure in the vacuum chamber 104. Instead or additionally, the pressure sensor 120 can be connected to a switch that enables or disables one or more components of the solder reflow system 100 based on the chamber pressure. For example, the switch can enable a valve and/or another component, e.g., an outlet valve of a tank holding the gas used for pressurization, only if the chamber pressure is below a threshold value, e.g., 0.5 atm. The switch can improve safety by preventing outgassing from the vacuum chamber 104.

The vacuum chamber 104 can be connected to a pump 124 via a foreline 126. The pump 124 can be configured to remove vapor from the vacuum chamber 104. In some implementations, one or more valves can enable/disable pumping of the vacuum chamber 104 by the pump 124. In some implementations, a foreline heater 128 at least partially surrounds the foreline 126. The foreline heater 128, e.g., a heating jacket, which can be configured to maintain the foreline 126 at a temperature that prevents condensation of the vapor inside the foreline 126, e.g., a temperature in a range from about 100° C. to about 150° C., such as in a range from about 120° C. to about 140° C.

Further, the solder reflow system 100 can be designed to perform a chemical treatment of the semiconductor wafer 102. In some implementations, such a treatment includes exposing the wafer to a chemical vapor that can reduce a portion of the wafer. As an illustrative example, some aspects of this disclosure can be applied to the use of a suitable chemical fluid, e.g., formic acid (HCOO), among others, for a solder reflow process. For example, flux-free reflow processing can be performed at relatively low temperatures in a formic acid atmosphere, providing improved bonds compared to processes that use a flux. The formic acid vapor can act as a reducing agent, chemically reacting with metal oxides, e.g., surface oxides on a metal pad, to remove the surface oxide layer and expose oxide-free solder alloy materials. In various implementations, this step is referred to as a soak step, which is followed by a reflow step to reflow the exposed solder material. The use of formic acid can reduce or eliminate the need for pre-reflow fluxing and post-reflow flux removal, and provides effective oxide removal at low temperatures for an overall flexible process. For example, a formic acid atmosphere during the soak step can effectively remove the oxide layers from solder materials that include tin.

Accordingly, in some implementations, the solder reflow system 100 is equipped with a vapor delivery system, which can include a vaporizer 130 and a vapor line 132 as illustrated in FIG. 1. The chemical can be supplied from a source to the vaporizer 130 to vaporize and the chemical vapor can be delivered to the vacuum chamber 104 though the vapor line 132. In various implementations, the vapor line 132 is designed to evenly distribute the chemical vapor across the surface of the semiconductor wafer 102, for example, through a series of ejection holes on the vapor line 132. In various implementations, the vapor delivery system is understood to include any other appropriate components, e.g., a pressurizer, valve, and controller, to facilitate the chemical fluid delivery. In some implementations, the vapor delivery system includes multiple vaporizers connected to the same and/or different sources of liquid and connected to the vacuum chamber 104 and/or one or more other chambers.

The controller 122 is understood to be one or more computing systems connected to one or more components of the solder reflow system 100 to receive signals indicative of physical parameters of the solder reflow system 100, e.g., pressure(s), temperature(s), and/or the like, and to send signals that control elements of the solder reflow system 100. For example, as discussed below, the controller 122 can send signals to the heating element 108 to maintain the internal temperature of the chamber within a target range. The controller 122 can include one or more computing systems local to and/or remote from other components of the solder reflow system 100.

In various implementations, the controller 122 is configured to perform optical endpoint control for a solder reflow process, e.g., by (i) heating the semiconductor wafer; (ii) during the heating of the semiconductor wafer 102, making and recording measurements of the temperature of the semiconductor wafer 102 using the two means, e.g., the thermocouple 112 and the pyrometer 114; and (iii) determining a modification of the heating of the semiconductor wafer 102 based on the obtained measurements. The methods of optical endpoint control are further described in detail below referring to FIGS. 4A-4C.

In some implementations, the controller 122 includes a computing system. The term "computing system" as used in this disclosure may encompass all apparatus, devices, and machines for processing data, including by way of example a programmable processor, a computer, or multiple processors or computers. A computing system, such as the controller 122, can include, in addition to hardware, code that creates an execution environment for the computer program in question, e.g., code that constitutes processor firmware, a protocol stack, a database management system, an operating system, or a combination of one or more of them.

A computer program, also known as a program, software, software application, script, executable logic, or code, can be written in any form of programming language, including compiled or interpreted languages, or declarative or procedural languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Computer readable media suitable for storing computer program instructions and data include all forms of nonvolatile or volatile memory, media and memory devices, including by way of example semiconductor memory devices, e.g., EPROM, EEPROM, and flash memory devices; magnetic disks, e.g., internal hard disks or removable disks or magnetic tapes; magneto optical disks; and CD-ROM and DVD-ROM disks. The processor and the memory can be supplemented by, or incorporated in, special purpose logic circuitry. Sometimes a server is a general-purpose computer, and sometimes it is a custom-tailored special purpose electronic device, and sometimes it is a combination of these things.

Implementations can include a back end component, e.g., a data server, or a middleware component, e.g., an application server, or a front end component, e.g., a client computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

Figure 2:
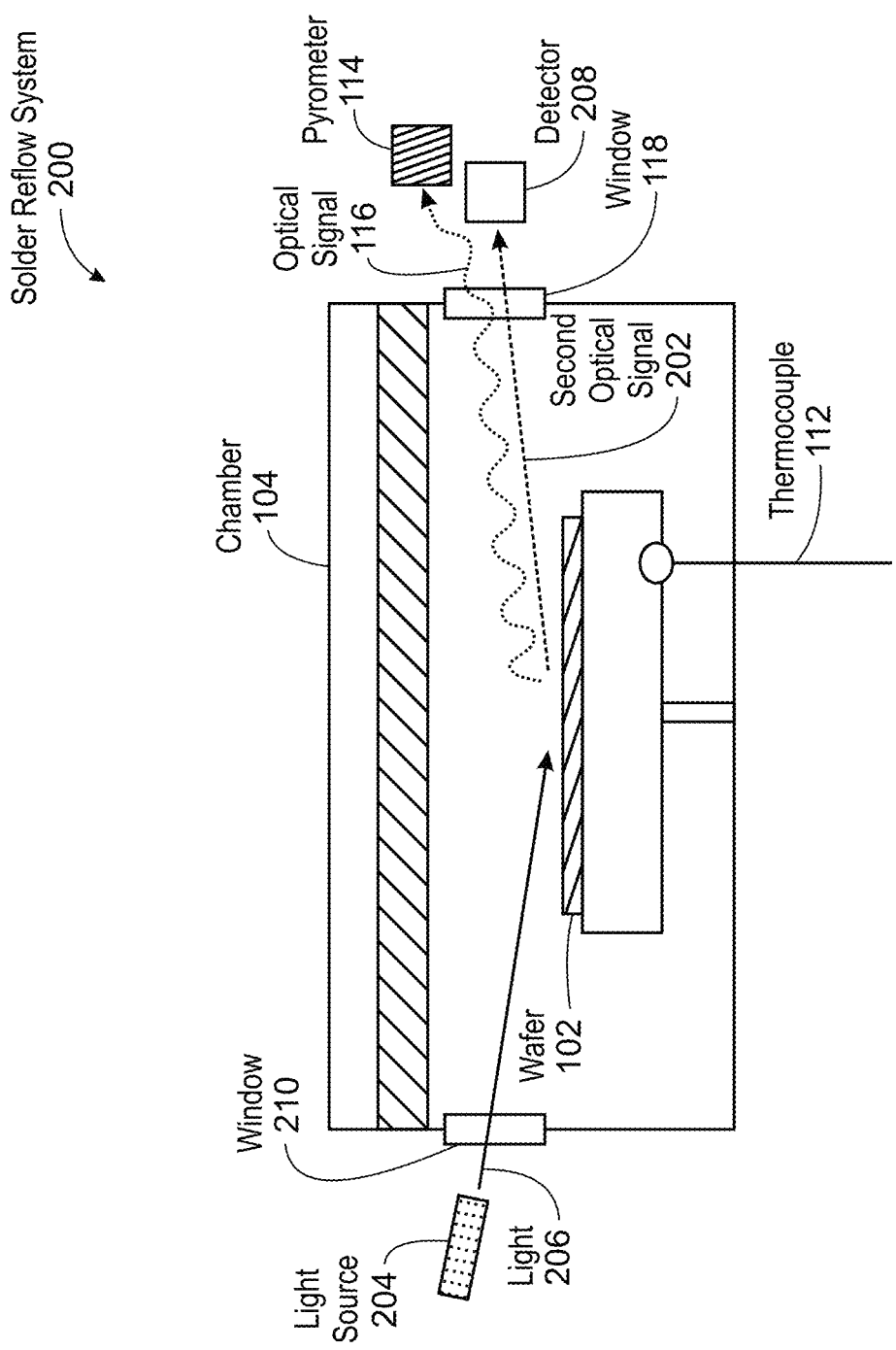
FIG. 2 shows a schematic of a solder reflow system having a pyrometer and a secondary optical system for optical endpoint control.

In accordance with another implementation, FIG. 2 shows a solder reflow system 200 having a secondary optical system for optical endpoint control. Most components of the solder reflow system 200, except the secondary optical system, can be identical or similar to those described in FIG. 1, and thus will not be repeated. Further, some of the above-described components are omitted in the solder reflow system 200 for illustration purpose.

The secondary optical system can use a second optical signal 202 to improve the accuracy and reliability of the optical endpoint control by the optical signal 116 alone. In some implementations, the secondary optical system is designed to monitor changes in reflectivity of the semiconductor wafer 102, which can supplement or replace the reliance on IR emissivity in the optical endpoint control. During reflow, the surface undergoes both reflectivity and morphology changes. For example, the surface shape may change from rough and slightly concave to smooth and strongly convex. Such a change can be detected using a diffuse light-source, e.g., a light source 204 to emit a light 206 in FIG. 2, and a wavelength-specific detector, e.g., a photodetector 208 to detect the second optical signal 202 in FIG. 2. For example, the photodetector 208 can include a charge-coupled device (CCD) or complementary metal-oxide-semiconductor (CMOS).

Further, instead of or in addition to reflectometry, the secondary optical system can also be designed to measure scattering patterns of the light 206. As further described below referring to FIGS. 4A-4C, 7A-7B, and 8A-8B, the reflow involves morphology changes, the reflected light from surface can yield different scattering patterns as the process proceeds. Accordingly, in some implementations, the information of scattering patterns obtained by the secondary optical system can supplement the IR-based pyrometer analysis.

In some implementations, the light source 204 can be a laser that emits visible lights. For example, a blue laser, e.g., at a wavelength from about 450 nm to about 490 nm, can be used. In some implementations, the blue laser can be made using gallium nitride (GaN) and/or indium gallium nitride (InGaN). Another example for the visible light laser is a green laser, e.g., at a wavelength of about 532 nm. In some implementations, the green laser can be made using neodymium-doped yttrium aluminum garnet (Nd: YAG). The use of these wavelengths for the secondary optical system can avoid any interference of IR signals originating from the heating element 108, e.g., an IR lamp, supplementing the IR-based pyrometer analysis susceptible to emissivity errors. As further illustrated in FIG. 2, the light source 204 can be positioned outside the vacuum chamber 104 that has a window 210 to allow the light 206 to pass through.

Figure 3:
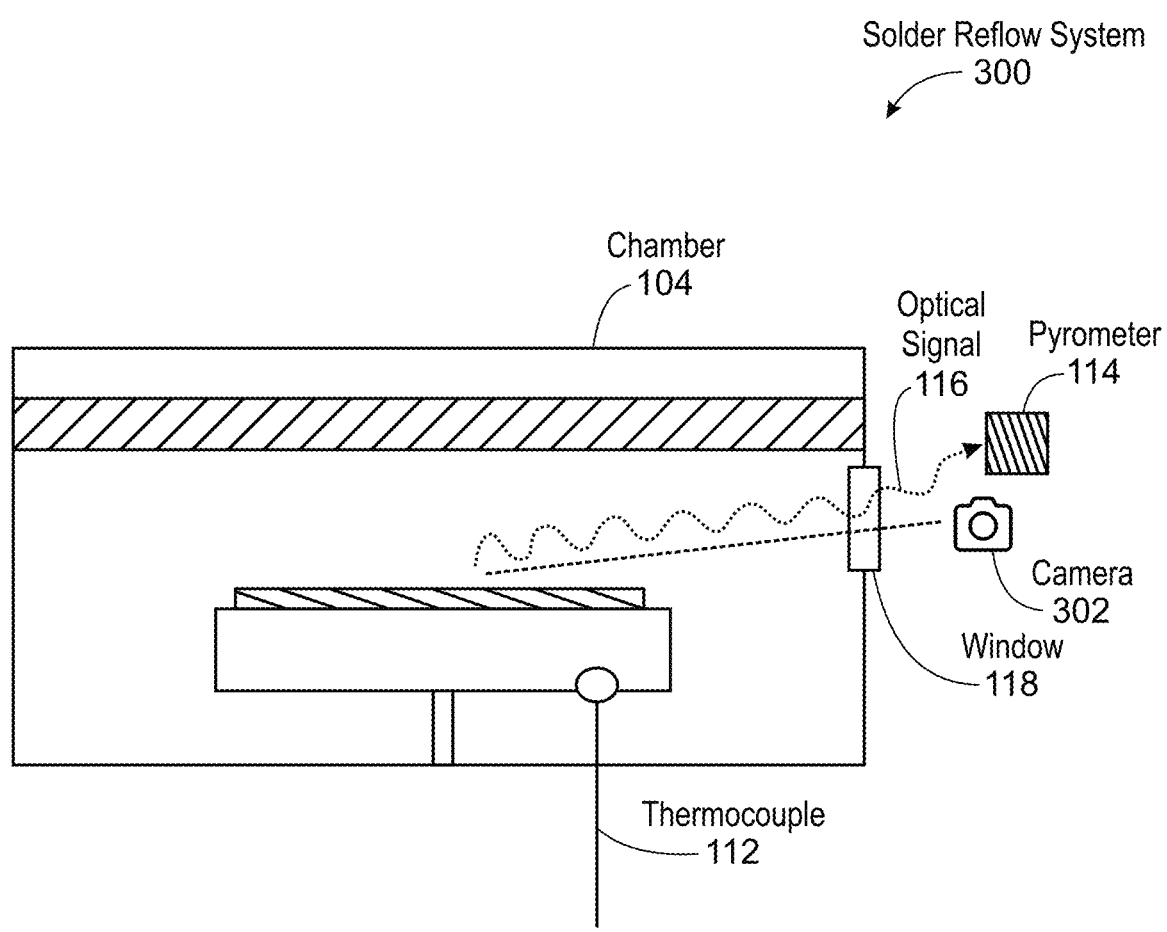
FIG. 3 shows a schematic of a solder reflow system having an imaging system.

In accordance with yet another implementation, FIG. 3 shows a solder reflow system 300 having an imaging system. Most components of the solder reflow system 300, except the imaging system, can be identical or similar to those described in FIG. 1, and thus will not be repeated. Further, some of the above-described components are omitted in the solder reflow system 300 for illustration purpose.

The imaging system can use, for example, a camera 302 as illustrated in FIG. 3, to capture an image and/or video of the semiconductor wafer during the solder reflow process as a part of the optical endpoint control. The captured image and/or video can be used to determine a change in shape, color, or brightness of the surface of the semiconductor wafer 102, which can be indicative of the progress of the process.

In some implementations, the camera 302 is equipped with a white light LED for illumination. In some implementations, the camera 302 is mounted on a fixture (spider) to allow movement of its position for image/video capture. In some implementations, the camera 302 can be configured to continuously record a video of a rotating wafer. In some implementations, the camera 302 and the semiconductor wafer 102 can be rotated simultaneous such that their relative positions remain unchanged, which prevents any image quality impairing due to movement.

The solder reflow system 100, 200, 300 as described above can be used to perform a solder reflow process with optical endpoint control. In various implementations, the solder reflow process can be performed as a multi-step process, which generally causes stepwise structural changes on a wafer, e.g., the semiconductor wafer 102 in FIGS. 1-3, which can be monitored based on optical measurements, e.g., IR emission.

Figure 4:
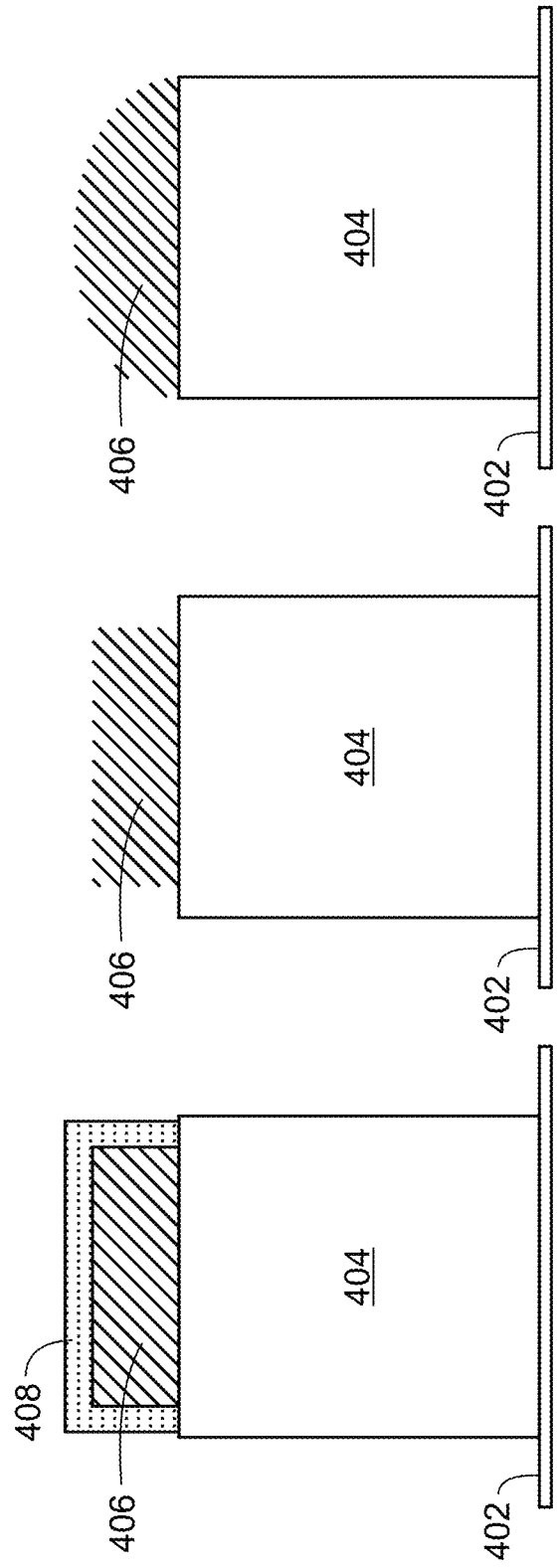
FIGS. 4A-4C show cross-sectional views of a section of a semiconductor wafer having a solder region during a solder reflow process at various stages.

In some implementations, the solder reflow process can include a soak step and a reflow step. FIGS. 4A-4C show a cross-sectional views of a section of a semiconductor wafer 402 during a solder reflow process at various stages: an initial stage before the soak step to remove a surface oxide layer (FIG. 4A); after the soak step (FIG. 4B); and after the reflow step (FIG. 4C). FIGS. 4A-4C are simplified for illustration purpose and can include various additional two-dimensional and/or three-dimensional structural features for semiconductor devices. FIG. 5 shows a temperature profile that corresponds to these steps of the solder reflow process.

In FIG. 4A, the semiconductor wafer 402 has a pillar 404, on which a solder portion 406 is formed. In various implementations, the pillar 404 is a part of a conductive line or other feature, e.g., copper line, which is to be soldered for semiconductor device fabrication. The solder portion 406 can be made of one or more suitable solder materials. For example, lead-free solder alloys, e.g., tin-silver-copper (SAC), tin-copper (SnCu), tin-bismuth (SnBi), tin-silver (SnAg), or tin-copper-nickel (SnCuNi), can be used. Since the reflow characteristics can depend on the type of solder alloys, the precise process control can be challenging. The use of optical endpoint control of this disclosure can eliminate or mitigate this issue by enabling real-time, direct observation of the structural changes on surface regardless of the material used.

As illustrated in FIG. 4A, prior to the solder reflow process, the external surface of the solder portion 406 can be covered by a surface oxide layer 408. The primary purpose of the soak step of solder reflow process is to treat the surface to remove this layer without damaging any other portions and components present on the semiconductor wafer 402. In some implementations, the pillar 404 has an oxide layer such as copper oxide. Accordingly, the soak step can be programmed to selectively remove only the surface oxide layer 408.

In various implementations, this selective removal can be achieved by exposing the semiconductor wafer 402 to a vapor of a reducing agent, e.g., formic acid, in a controlled fashion at an elevated temperature, e.g., from about 150° C. to about 180° C. ($T_1$ in FIG. 5). In some implementations, formic acid pressure in the vacuum chamber 104 is maintained in a range from about 125 Torr to about 175 Torr, with the understanding that various different chamber pressures can be used for various processes.

Prior to introducing the reducing agent to the vacuum chamber 104, the vacuum chamber 104 can be evacuated to remove air and moisture. This evacuation step can include pursing the system with an inert gas such as nitrogen ($N_2$), evacuating, and repeating these cycles.

At the soak step, the temperature can be held constant for a predetermined duration. In some implementations, the process time ($d_1$ in FIG. 5) can be from about 0.5 min to about 5 min, e.g., from about 1 min to about 2 min. Alternately, the optical signal such as IR emission and/or reflectivity can be monitored by the solder reflow system for its endpoint and the soak step can be terminated once the endpoint is determined. The process time in the soak step is set to obtain an ideal intermediate structure for the subsequent reflow step. For example, if the process time is too short and fails to remove the surface oxide layer 408 sufficiently, the reflow step may require a longer process time and/or a higher process temperature. On the other hand, the excessive treatment at the soak step can alter the characteristics of the pillar 404, for example by removing the copper oxide, which will subsequently affect the reflow step. In some implementations where the soaking was excessive and the copper oxide is removed, the solder melt may flow down the walls of the pillar 404.

The completion of the removal of the surface oxide layer 408 by the soak step can be determined using the optical endpoint control capability of the solder reflow system 100, 200, 300. As described above, the solder reflow system can compare the two means for temperature measurements: thermocouple and pyrometer. In implementations where an IR pyrometer is used, IR emission from the surface of the semiconductor wafer 402 is measured to estimate the temperature. The IR pyrometer can be calibrated by matching thermocouple to pyrometer data with an assumption that IR emissivity remains constant. In this case, since the surface composition changes as the surface oxide layer 408 is being removed, this assumption is not valid. In other words, since the IR emission is a function of the object's temperature and its IR emissivity, when the temperature of the object remains constant supported by the thermocouple during processing, a change in IR emission and the estimated temperature by the pyrometer indicates a change in IR emissivity due to changes in the surface chemical composition and/or morphology. Accordingly, the method of optical endpoint control during the soak step can include comparing the measured temperature by the two means and determine the change in IR emissivity based on the comparison. In some implementations, the IR emissivity is lowered once the solder material is exposed.

Further, in implementations with the secondary optical system, changes in reflectivity can also be monitored and used for optical endpoint control. In some implementations, the removal of the surface oxide layer 408 results in significantly brighter surfaces with higher reflectivity.

In various implementations, the method further includes determining the completion of the removal of the surface oxide layer 408 and terminate the soak step by changing at least one process parameter of the solder reflow system 100. In some implementations, the termination of the soak step can be performed by evacuating the vacuum chamber 104 to remove any products from the treatment and remaining reactants, e.g., formic acid, and raising the chamber temperature to start the subsequent reflow process. A purge with an inert gas such as $N_2$ can be incorporated as a part of the evacuating step between the soak and reflow steps.

In FIG. 4B, the semiconductor wafer 402 is after the soak step and at the beginning of the subsequent reflow step, and the solder portion 406 is exposed with the complete removal of the surface oxide layer 408. Since the solder material is not yet melted or reflowed, the shape of the solder portion 406 is expected to remain substantially unchanged from FIG. 4A. By holding the chamber temperature at another elevated temperature e.g., from about 230° C. to about 250° C. ($T_2$ in FIG. 5), under vacuum.

At the reflow step, the temperature can be held constant for a predetermined duration. In some implementations, the process time ($d_2$ in FIG. 5) can be from about 0.2 min to about 2 min, e.g., from about 0.5 min to about 1.5 min. Alternately, the optical signal such as IR emission or reflectivity can be monitored by the solder reflow system for its endpoint and the reflow step can be terminated once the endpoint is determined.

In FIG. 4C, the semiconductor wafer 402 is after the reflow step. The solder material is held at a temperature high enough to melt and flow. The reflow step can be considered complete once the solder material melt and have reflowed to form a smooth and spherical shape as illustrated in FIG. 4C. Once the predetermined process time has passed or the endpoint of the reflow step is determined, the system can be quickly cooled down to prevent the formation of intermetallic nodules on the sidewalls of the pillar 404.

In FIG. 6, the relation between time above liquidus (TAL) and emissivity or reflectivity is illustrated for a duration of the reflow step and subsequent cooling step. When the semiconductor wafer is heated to the process temperature for the reflow step, the solder material begins to melt and transition from solid to liquid starts. In various implementations, as illustrated in FIG. 6, the IR emissivity substantially decreases during this transition, and once the solder material is completely melted and flowing, it levels off, indicating the TAL. While not specifically illustrated, the reflectivity, on the other hand, is expected to substantially increase upon solid to liquid transition. Estimating the starting point of the TAL based on this analysis of emissivity and/or reflectivity can help optimize the TAL to improve the efficiency of the solder flow without causing damages or undesired side-effects to the semiconductor wafer. In FIG. 6, solid-to-liquid transition at the end of the melting stage signifies the endpoint of the reflow step, and the TAL represents an additional reflow time required to ensure complete reflow after endpoint. In various implementations, the transition from liquid to solid upon cooling down after the reflow process reverses these parameters: increase in emissivity and decrease in reflectivity.

The change in the shape of the solder portion 406 (FIGS. 4A-4C) due to solder reflow is demonstrated by experiments. FIGS. 7A-7B show scanning electron microscopic (SEM) images of a solder region over a copper pillar made on a substrate before a reflow process. The SEM samples were prepared by fixing the substrates processed for solder reflow to a sample holder. FIG. 7A is a perspective view and FIG. 7B is a top view. As can be seen in FIGS. 7A and 7B, the solder region has a rough surface both on top and side. Further, FIG. 7A shows a slightly concave shape at the top of the solder region. The shape and surface morphology substantially changes upon solder reflow. FIGS. 8A-8B show SEM images of the solder region after the reflow process. FIG. 8A is a perspective view and FIG. 8B is a top view. Both FIGS. 8A and 8B show the surface becomes much smoother with almost no visible wrinkles. FIG. 8A also shows a round and convex surface.

Figure 9A:
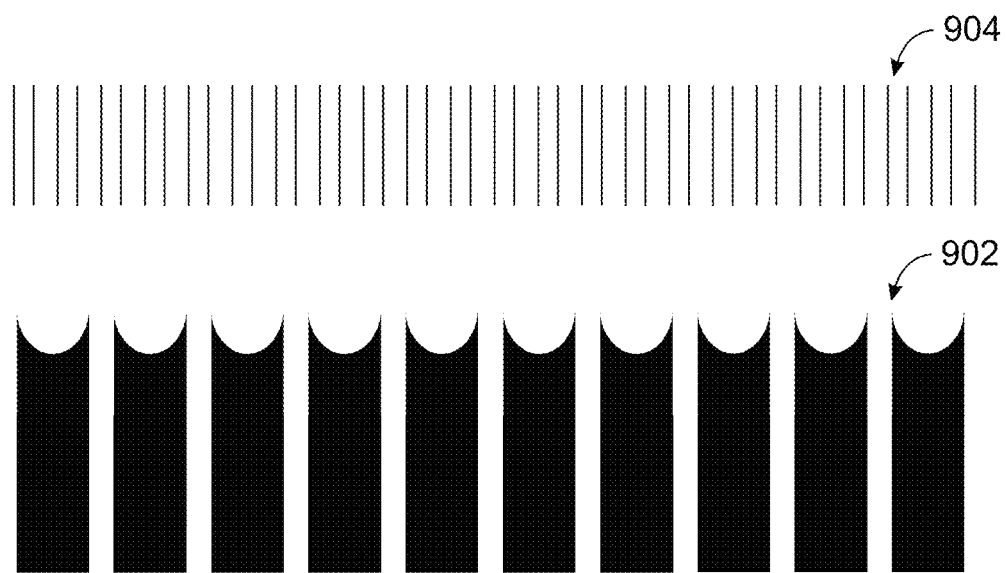
FIGS. 9A-9B show schematics of a scattering pattern from a concave surface morphology over pillars made on a substrate.
Figure 9B:
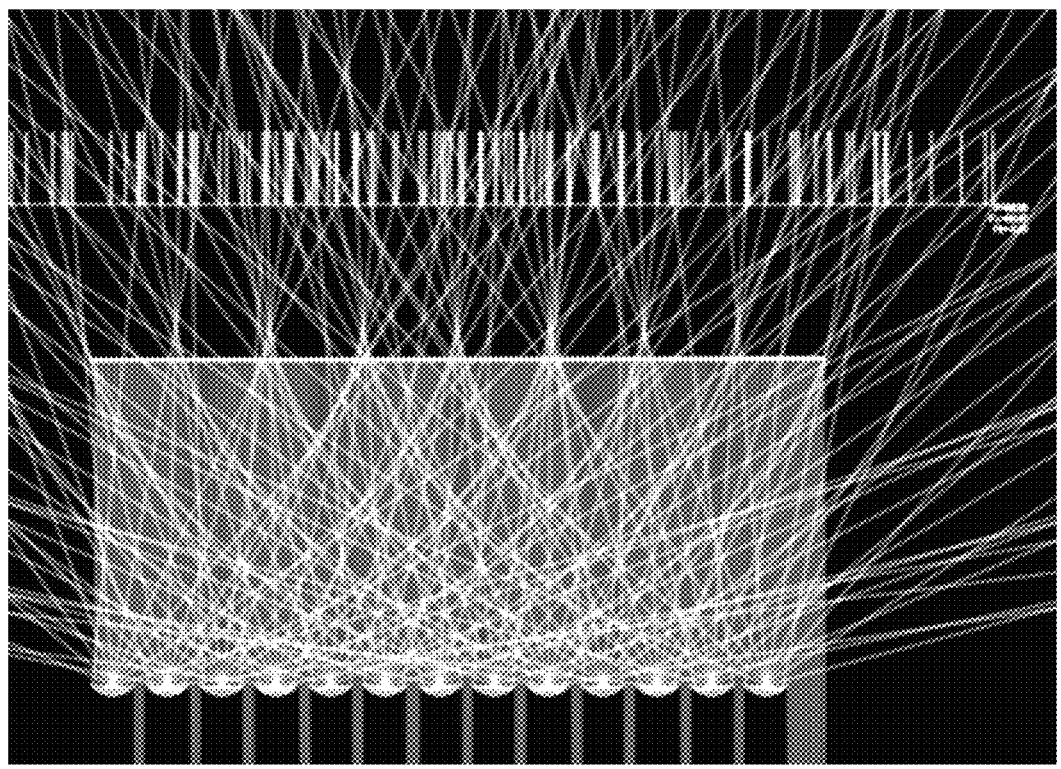

This surface morphological change, particularly from concave to convex, can also enable using scattering patterns as the optical signal indicative of the progress of the reflow process. In some implementations, the semiconductor wafer can have a series of pillars or similar repeating features with solder portions. In FIG. 9A, a schematic of a series of concave-top pillars 902 and an example scattering pattern 904 that can result from it are illustrated. In some implementations, the series of concave-top pillars 902 represents the solder portion prior to the solder flow as shown above in FIGS. 7A-7B. In FIG. 9B, the paths of reflected laser beam from a series of concave mirrors are illustrated to simulate the scattering pattern from the series of concave-top pillars 902, where a relatively uniform illumination pattern without concentrated bright/dark spots.

Figure 10A:
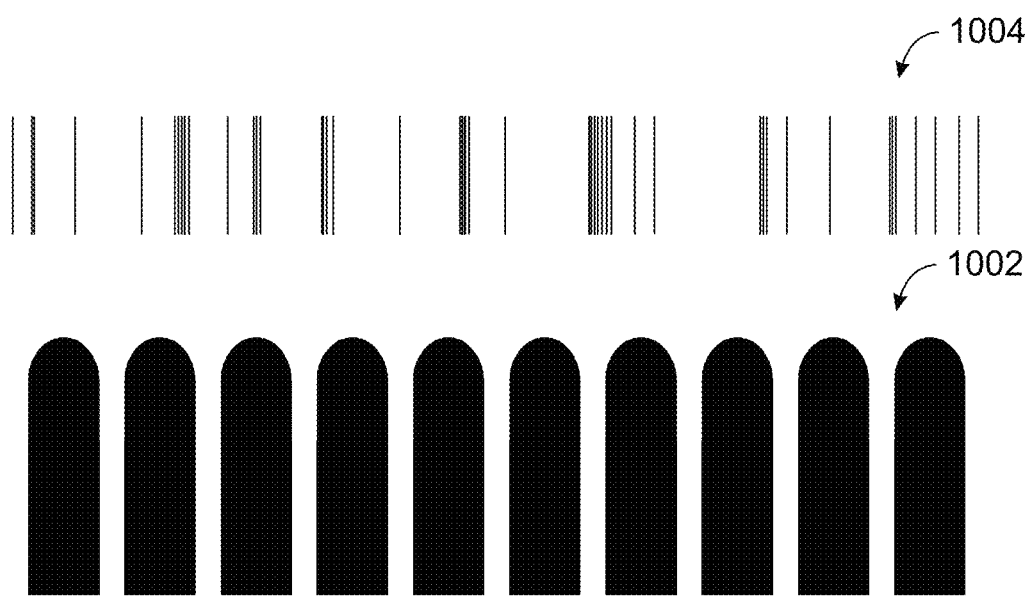
FIGS. 10A-10B show schematics of a scattering pattern from a convex surface morphology over pillars made on a substrate.
Figure 10B:
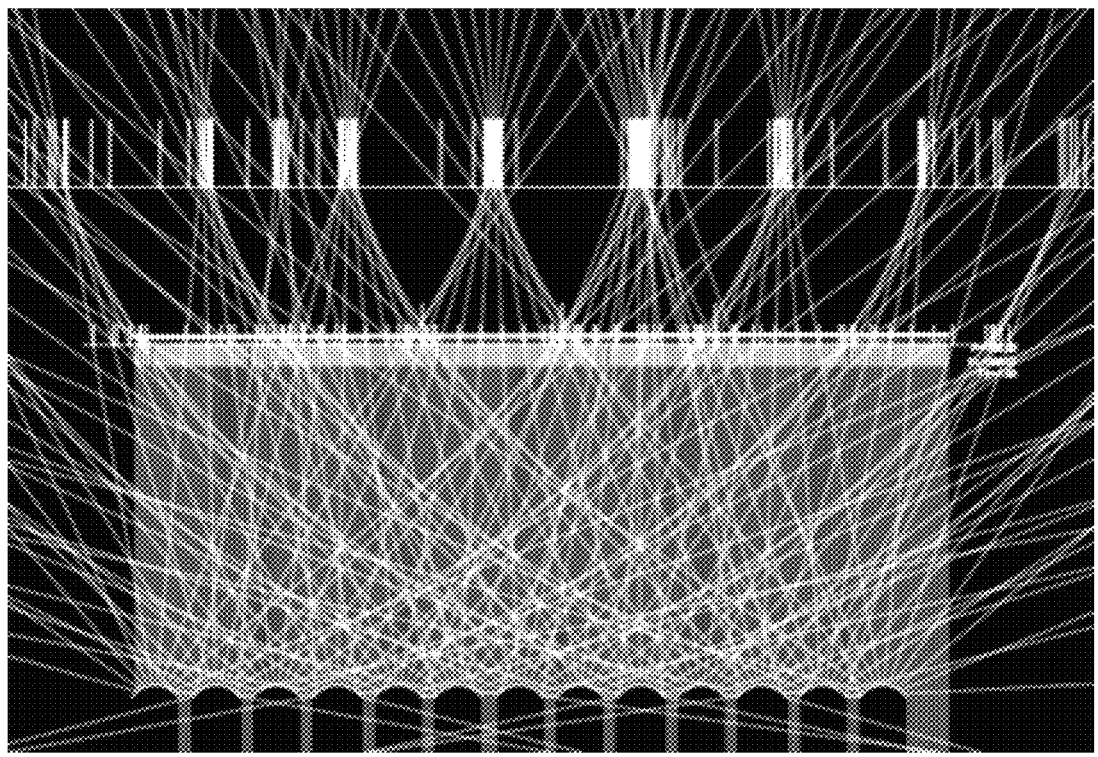

On the other hand, in FIG. 10A, a schematic of a series of convex-top pillars 1002 and an example scattering pattern 1004 that can result from it are illustrated. In some implementations, the series of convex-top pillars 1002 represents the solder portion after the solder flow as shown above in FIGS. 8A-8B. In FIG. 10B, the paths of reflected laser beam from a series of convex mirrors are illustrated to simulate the scattering pattern from the series of convex-top pillars 1002, where an illumination pattern results in the uneven distribution of points of high and low intensity.

This contrast in scattering between the two surface morphologies that represent before and after the solder reflow process demonstrates the capability of the solder reflow system to use scattering patterns as another means for optical endpoint control. In various implementations, scattering measurements can be incorporated in the solder reflow process in addition to or in place of reflectometry as the secondary optical system to supplement the IR-based pyrometer analysis.

Figure 11:
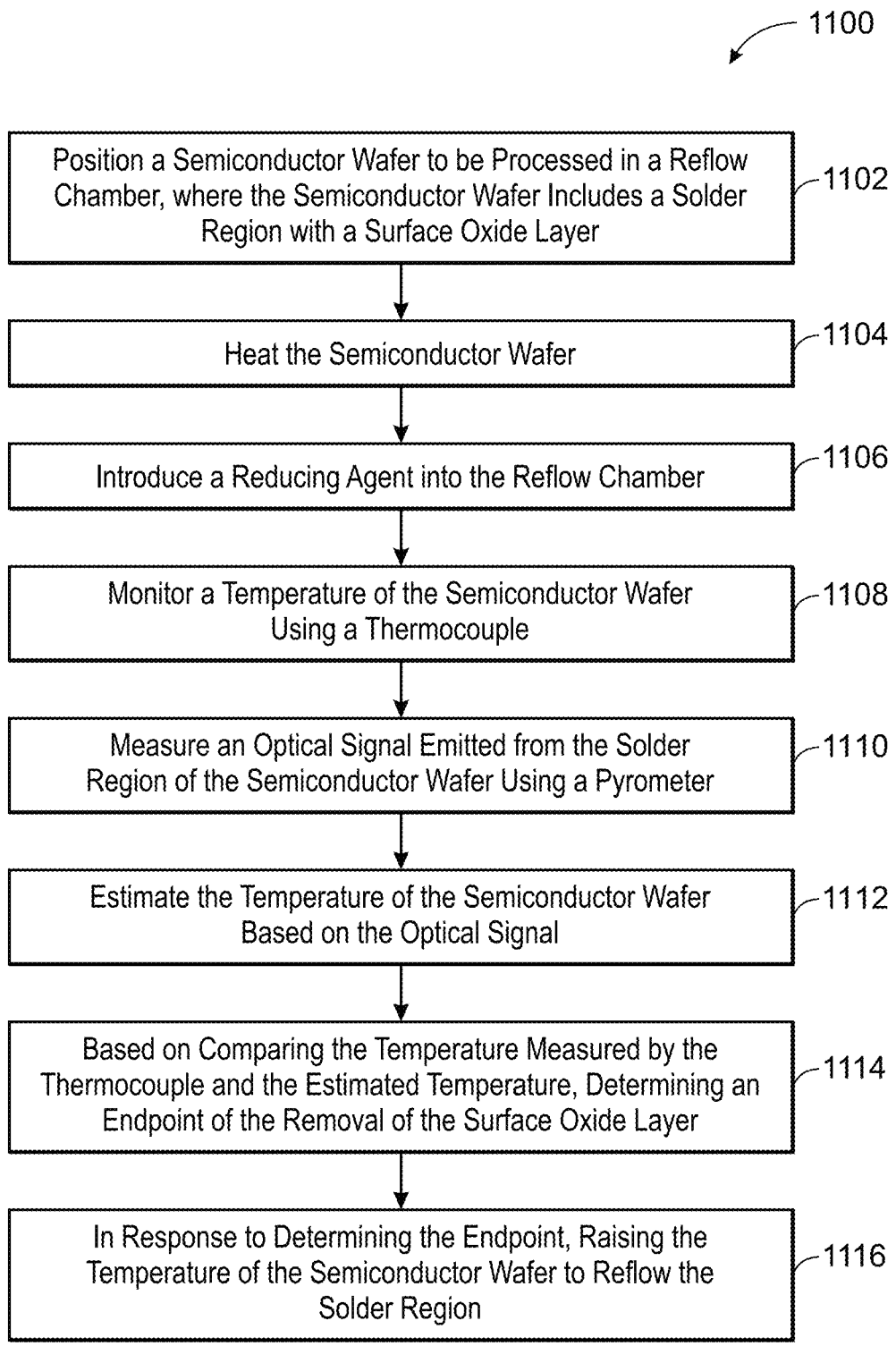
FIG. 11 shows a process flow diagram of an example method of solder reflow process with optical endpoint control.

FIG. 11 illustrates a process flow diagram of method of solder reflow that can be performed using the solder reflow system described herein, e.g., the solder reflow system 100, 200, 300. A process 1100 can start with a step 1102 of positioning a semiconductor wafer to be processed in a vacuum chamber. The semiconductor wafer can include a solder region with a surface oxide layer. At a step 1104, the semiconductor wafer is heated using a heating element. At a step 1106, a reducing agent configured to remove the surface oxide layer is introduced into the vacuum chamber. At a step 1108, a temperature of the semiconductor wafer is monitored using a thermocouple coupled to a sample chuck supporting the semiconductor wafer, and at a step 1110, an optical signal emitted from the solder region of the semiconductor wafer is measured using a pyrometer. Subsequently, the process 1100 proceeds to a step 1112 of estimating the temperature of the semiconductor wafer based on the optical signal measured by the pyrometer. At a step 1114, based on comparing the temperature measured by the thermocouple and the estimated temperature, an endpoint of the removal of the surface oxide layer is determined. In response to determining the endpoint, at a step 1116, the temperature of the semiconductor wafer is raised to reflow the solder region.

The optical endpoint control in various implementations is particularly suitable for detecting endpoint when the reflowed solder bump surface is exposed. While the method may not be directly applicable to die-to-wafer or other types of bonding applications where reflowing surfaces are not visible to sensors, measurements of a test-chip can be performed by the solder reflow system in these cases. The test-chip with copper pillars and solder coating can be inserted into the carrier-plate or somewhere in the vacuum chamber. This solder of the test-chip can be made to reflow, and the optical emissivity/reflectivity signals can be measured to provide process kinetics. This test-chip can have a range of metal features, e.g., various diameters or metal density, and substrate, e.g., various types of emissivity, thickness, or doping so as to mimic any work-product for which endpoint control is needed. The processed test-chip can be characterized separately to collect information for estimating endpoint.

While this disclosure contains many specific implementation details, these should not be construed as limitations on the scope of any invention or of what may be claimed, but rather as descriptions of features that may be specific to particular implementations of particular inventions. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results.

What is claimed is:

1. A solder reflow apparatus comprising:
    a vacuum chamber;
    a sample chuck in the vacuum chamber to support a semiconductor wafer to be processed, the semiconductor wafer comprising a solder region with a surface oxide layer;
    a heating element coupled to the vacuum chamber and configured to heat the semiconductor wafer;
    a thermocouple connected to the sample chuck to measure a temperature of the semiconductor wafer;
    a pyrometer positioned to detect an optical signal from the semiconductor wafer to estimate the temperature of the semiconductor wafer; and
    a control system configured to
        control the heating element to heat the semiconductor wafer,
        introduce a reducing agent into the vacuum chamber, the reducing agent configured to remove the surface oxide layer,
        during the heating of the semiconductor wafer, obtain one or more measurements of the temperature of the semiconductor wafer from the thermocouple and one or more estimates of the temperature of the semiconductor wafer from the pyrometer, and
        determine a modification of the heating of the semiconductor wafer based on the obtained measurements.

2. The solder reflow apparatus of claim 1, wherein determining the modification of the heating of the semiconductor wafer based on the obtained measurements comprises:
    comparing the one or more measurements from the thermocouple to the one or more estimates from the pyrometer;
    based on the comparison, determining if a difference between the one or more measurements form the thermocouple and the one or more estimates from the pyrometer begins to change; and
    if yes, modifying a parameter of the heating element.

3. The solder reflow apparatus of claim 1, wherein the pyrometer is positioned outside the vacuum chamber, and the vacuum chamber comprises a window positioned to allow the optical signal to pass through and reach the pyrometer.

4. The solder reflow apparatus of claim 1, wherein the pyrometer is an infrared (IR) pyrometer, and the optical signal is an IR emitted from the semiconductor wafer.

5. The solder reflow apparatus of claim 4, wherein the obtained measurements comprise a change in IR emissivity of the semiconductor wafer during the heating, and the change in IR emissivity is determined by comparing the one or more measurements from the thermocouple to the one or more estimates from the pyrometer.

6. The solder reflow apparatus of claim 1, further comprising a secondary optical system to measure a reflected visible light from the semiconductor wafer, wherein the secondary optical system comprises:
    a light source positioned to emit a visible light to irradiate the semiconductor wafer, at least a portion of the light reflecting on a surface of the semiconductor wafer, wherein the visible light having wavelengths outside IR; and
    a detector positioned to detect the reflected visible light from the semiconductor wafer,
    wherein the control system is coupled to the light source and the detector, and is further configured to,
        obtain one or more measurements of the reflected visible light,
        based on the one or more measurements of the reflected visible light, determine a change in reflectivity of the semiconductor wafer during the heating of the semiconductor wafer, and
        based on the change in reflectivity, change a parameter of the heating element.

7. The solder reflow apparatus of claim 6, wherein the source comprises a blue laser having a wavelength from 450 nm to 490 nm or a blue laser at a wavelength of about 532 nm.

8. The solder reflow apparatus of claim 6, wherein the control system is further configured to, based on the reflected light, determine a change in scattering pattern during the heating.

9. The solder reflow apparatus of claim 1, further comprising an imaging system comprising a camera positioned outside the vacuum chamber, wherein the vacuum chamber comprises a window positioned to allow the camera to capture one or more images or videos of the semiconductor wafer during the heating, and the control system is coupled to the camera and is configured to:
    determine, based on the one or more images or videos, a change in shape, color, or brightness of a surface of the semiconductor wafer; and
    based on the change, change a parameter of the heating element.

10. The solder reflow apparatus of claim 1, wherein the control system is further configured to:
    based on the obtained measurements, determine an endpoint of the removal of the surface oxide layer; and
    in response to determining the endpoint, raise the temperature of the semiconductor wafer to reflow the solder region.

11. The solder reflow apparatus of claim 10, the control system is further configured to, in response to determining the endpoint, remove an unreacted portion of the reducing agent from the vacuum chamber prior to raising the temperature of the semiconductor wafer to reflow the solder region.

12. The solder reflow apparatus of claim 10, further comprising:
    a visible light source positioned to irradiate a visible light to the semiconductor wafer; and
    a detector to detect a reflected visible light from the semiconductor wafer, wherein the control system is further configured to:
        monitor an intensity of the reflected light at a fixed location using the detector, and based on the intensity of the reflected light, determine a change in reflectivity, wherein determining the endpoint of the removal of the surface oxide layer is based on the change in reflectivity.

13. The solder reflow apparatus of claim 10, further comprising:
   a visible light source positioned to irradiate a visible light to the semiconductor wafer; and
   a detector to detect a reflected visible light from the semiconductor wafer, wherein the control system is further configured to:
      while reflowing the solder region, monitor an intensity of the reflected light at a fixed location using the detector,
      based on the intensity of the reflected light, determine a change in reflectivity,
      based on the change in reflectivity, determine a reflow endpoint, and
      in response to determining the reflow endpoint, lower the temperature of the semiconductor wafer to terminate the reflow.

14. The solder reflow apparatus of claim 10, the control system is further configured to:
   monitor a scattering pattern of the reflected light using the detector; and
   based on the scattering pattern of the reflected light, determine a change in the scattering pattern, wherein determining the endpoint of the removal of the surface oxide layer is based on the change in the scattering pattern.

15. The solder reflow apparatus of claim 10, the control system is further configured to,
   while reflowing the solder region, monitor a scattering pattern of the reflected light using the detector, and
   based on the scattering pattern of the reflected light, determine a change in the scattering pattern,
   based on the change in the scattering pattern, determine a reflow endpoint, and
   in response to determining the reflow endpoint, lower the temperature of the semiconductor wafer to terminate the reflow.

\* \* \* \* \*